(12) United States Patent  (10) Patent No.: US 9,117,719 B2
Saito  (45) Date of Patent: Aug. 25, 2015

(54) SOLID-STATE IMAGING APPARATUS, MANUFACTURING METHOD FOR THE SAME, AND ELECTRONIC APPARATUS

(71) Applicant: Sony Corporation, Tokyo (JP)

(72) Inventor: Hiromasa Saito, Tokyo (JP)

(73) Assignee: SONY CORPORATION (JP)

( * ) Notice: Subject to any disclaimer, the term of this patent is extended or adjusted under 35 U.S.C. 154(b) by 0 days.

(21) Appl. No.: 14/035,638

(22) Filed: Sep. 24, 2013

(65) Prior Publication Data

US 2014/0091415 A1 Apr. 3, 2014

(30) Foreign Application Priority Data

Oct. 1, 2012 (JP) ................................. 2012-219035

(51) Int. Cl.
*H01L 27/146* (2006.01)

(52) U.S. Cl.
CPC .... *H01L 27/14627* (2013.01); *H01L 27/14625* (2013.01); *H01L 27/14685* (2013.01)

(58) Field of Classification Search
CPC ..................... H01L 27/14625; H01L 27/14685

USPC .......................................................... 257/294
See application file for complete search history.

(56) References Cited

U.S. PATENT DOCUMENTS 8,274,586 B2 * 9/2012 Katsuno et al. ............... 348/294

FOREIGN PATENT DOCUMENTS

| JP | 2004-140426 | 5/2004 |
|----|-------------|--------|
| JP | 2005-249846 | 9/2005 |
| JP | 2006-196503 | 7/2006 |

* cited by examiner

*Primary Examiner* — William Coleman
(74) *Attorney, Agent, or Firm* — Sheridan Ross P.C.

(57) ABSTRACT

A solid-state imaging apparatus includes a semiconductor substrate, an upper layer film, and on-chip lenses. On the semiconductor substrate, a plurality of pixels are formed. The upper layer film is laminated on the semiconductor substrate. The on-chip lenses are formed on the upper layer film so as to correspond to the respective pixels. A pupil correction amount of one of the on-chip lenses is changed depending on a distance between a center of a pixel area and the on-chip lens, and depending on a film thickness of the upper layer film at a position of the on-chip lens on the upper layer film.

20 Claims, 16 Drawing Sheets

SOLID-STATE IMAGING APPARATUS, MANUFACTURING METHOD FOR THE SAME, AND ELECTRONIC APPARATUS

BACKGROUND

The present disclosure relates to a solid-state imaging apparatus, a manufacturing method for the same, and an electronic apparatus, and particularly to a solid-state imaging apparatus, a manufacturing method for the same, and an electronic apparatus, which are capable of improving shading characteristics.

In recent years, a camera module mounted on a portable terminal such as a cellular phone is expected to be further miniaturized. Along with this, in such a camera module, the distance between a lens and an imaging surface (eye point distance) tends to be shortened, which increases the difference between an amount of light incident on a pixel at the center portion of the imaging surface and an amount of light incident on a pixel at the peripheral portion. This causes sensitivity unevenness, which is called shading, in an image.

In view of the above, a pupil correction technique is used to improve shading characteristics.

For example, there is a technique in which shading characteristics are improved by displacing an on-chip lens at a different ratio depending on the distance from the center of an imaging surface of a light-receiving portion (see, for example, Japanese Patent Application Laid-open No. 2005-249846).

In addition thereto, a technique in which pupil correction is three-dimensionally performed by increasing the film thickness of an upper layer film toward the peripheral portion depending on the distance from the center of the imaging surface is proposed (see, for example, Japanese Patent Application Laid-open No. 2004-140426 and Japanese Patent Application Laid-open No. 2006-196503).

SUMMARY

In the technique disclosed in Japanese Patent Application Laid-open No. 2005-249846, however, it is assumed that the upper layer film has a uniform film thickness in the imaging surface, and thus if the film thickness is changed due to some causes in the process, it may be impossible to reliably improve shading characteristics.

Also in the techniques disclosed in Japanese Patent Application Laid-open No. 2004-140426 and Japanese Patent Application Laid-open No. 2006-196503, if the film thickness of the upper layer film varies due to some causes in the process, it may be impossible to reliably improve shading characteristics.

The present disclosure has been made in view of the above circumstances, and it is desirable to improve more reliably shading characteristics.

According to an aspect of the present disclosure, there is provided a solid-state imaging apparatus including a semiconductor substrate on which a plurality of pixels are formed, an upper layer film laminated on the semiconductor substrate, and on-chip lenses formed on the upper layer film so as to correspond to the respective pixels, a pupil correction amount of one of the on-chip lenses being changed depending on a distance between a center of a pixel area and the on-chip lens, and depending on a film thickness of the upper layer film at a position of the on-chip lens on the upper layer film.

The film thickness of the upper layer film may be represented by a function of a distance from a factor differentiating the film thickness of the upper layer film.

The function may be a linear function.

The function may be a non-linear function.

The upper layer film may include color filters formed so as to correspond to the respective pixels, and a pupil correction amount of one of the color filters may be changed depending on a distance between the center of the pixel area and the color filter, and depending on a film thickness of the upper layer film at a position of the color filter on the upper layer film.

The upper layer film may include light-shielding films formed so as to correspond to the respective pixels, and a pupil correction amount of one of the light-shielding films may be changed depending on a distance between the center of the pixel area and the light-shielding film, and depending on a film thickness of the upper layer film at a position of the light-shielding film on the upper layer film.

The factor differentiating the film thickness of the upper layer film may be OPB (Optical Black) pixel.

The factor differentiating the film thickness of the upper layer film may be a through hole via.

The factor differentiating the film thickness of the upper layer film may be an electrode pad.

The factor differentiating the film thickness of the upper layer film may be a wiring.

The factor differentiating the film thickness of the upper layer film may be a scribe line.

According to an aspect of the present disclosure, there is provided a method of producing a solid-state imaging apparatus including a semiconductor substrate on which a plurality of pixels are formed, an upper layer film laminated on the semiconductor substrate, and on-chip lenses formed on the upper layer film so as to correspond to the respective pixels, including forming the on-chip lenses by changing a pupil correction amount of one of the on-chip lenses depending on a distance between a center of a pixel area and the on-chip lens, and depending on a film thickness of the upper layer film at a position of the on-chip lens on the upper layer film.

According to an aspect of the present disclosure, there is provided an electronic apparatus, including a solid-state imaging apparatus including a semiconductor substrate on which a plurality of pixels are formed, an upper layer film laminated on the semiconductor substrate, and on-chip lenses formed on the upper layer film so as to correspond to the respective pixels, a pupil correction amount of one of the on-chip lenses being changed depending on a distance between a center of a pixel area and the on-chip lens, and depending on a film thickness of the upper layer film at a position of the on-chip lens on the upper layer film.

According to an aspect of the present disclosure, a pupil correction amount of an on-chip lens is changed depending on a distance between a center of a pixel area and the on-chip lens, and depending on a film thickness of an upper layer film at a position of the on-chip lens on the upper layer film.

According to an aspect of the present disclosure, it is possible to more reliably improve shading characteristics.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments according to the present disclosure will be described with reference to the drawings.
[Embodiments of Solid-State Imaging Apparatus]

Figure 1:
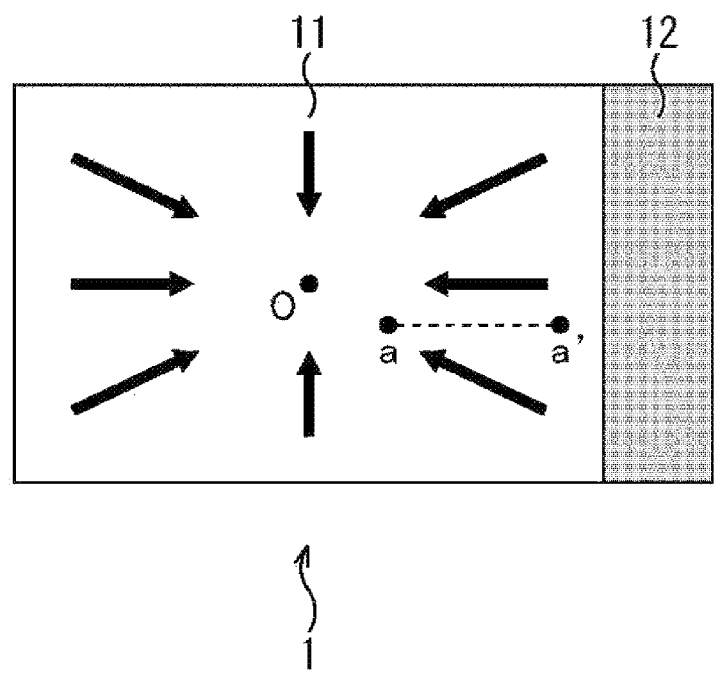
FIG. 1 is a plan view of a solid-state imaging apparatus to which the present disclosure is applied.
Figure 2:
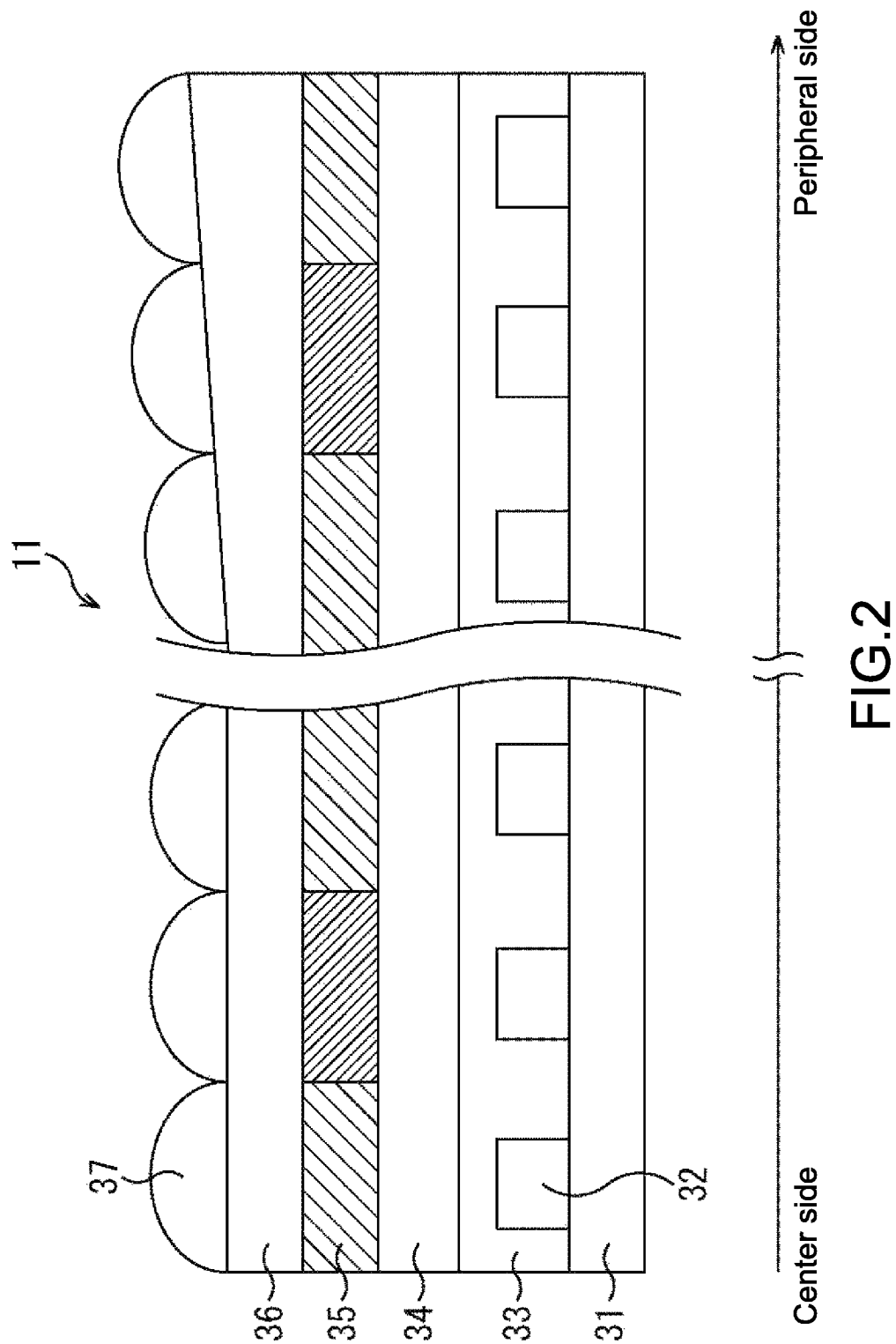
FIG. 2 is a cross-sectional view of the solid-state imaging apparatus to which the present disclosure is applied.
Figure 3:
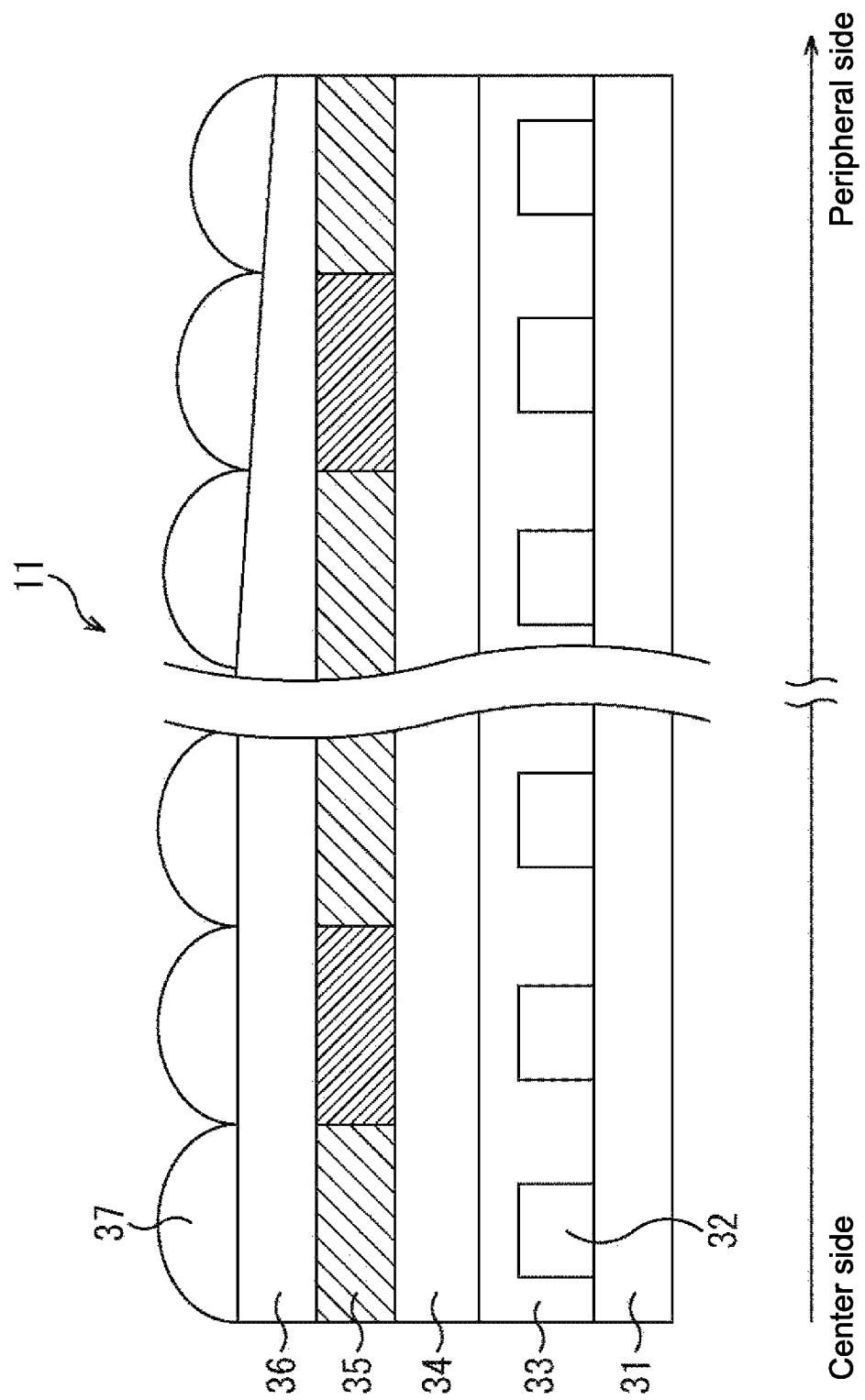
FIG. 3 is a cross-sectional view of the solid-state imaging apparatus to which the present disclosure is applied.

FIGS. 1 to 3 are a plan view and a cross-sectional view showing the configuration of an embodiment of a CMOS (Complementary Metal Oxide Semiconductor) image sensor serving as a solid-state imaging apparatus to which the present disclosure is applied. In the following, the CMOS image sensor will be described as a rear-surface irradiation type CMOS image sensor.

FIG. 1 is a plan view showing the appearance configuration of the CMOS image sensor, and FIGS. 2 and 3 are cross-sectional views taken along the line a-a' of the CMOS image sensor shown in FIG. 1.

As shown in FIG. 1, a pixel area 11 in which a pixel array including a plurality of pixels arranged in line is placed is provided in a CMOS image sensor 1. Furthermore, in the CMOS image sensor 1, a non-pixel area 12 in which a thing other than the pixel used for imaging is arranged adjacent to one side of the pixel area 11 (right side of FIG. 1) is provided.

Moreover, as shown in FIG. 2 and FIG. 3, in the pixel area 11, a semiconductor substrate 33 in which photodiodes 32 serving as the plurality of pixels are formed is formed on a wiring layer 31 formed on a supporting substrate (not shown). On the upper surface of the semiconductor substrate 33, a planarization film 34 is formed, and on the upper surface of the planarization film 34, color filters 35 are formed so as to correspond to each photodiode 32. Furthermore, on the upper surface of the color filters 35, an insulating film 36 is formed, and on the upper surface of the insulating film 36, on-chip lenses 37 are formed so as to correspond to each photodiode 32. It should be noted that in the following, the planarization film 34 formed on the upper surface of the semiconductor substrate 33 to the insulating film 36 are collectively referred to as upper layer film. The upper layer film may include, for example, a film with a high refractive index of 1.5 or more to prevent light reflection that is caused by the difference between the refractive indexes of the films included in the upper layer film.

As described above, the color filters 35 and the on-chip lenses 37 are provided for each pixel, and light entered from an optical lens (not shown) is incident on the corresponding photodiode 32 via the on-chip lens 37 and the color filter 35.

Here, although the light entered from an optical lens (not shown) is perpendicularly incident on the CMOS image sensor 1 at a center O (FIG. 1) of the pixel area 11, the incidence angle of the light increases toward the peripheral portion of the pixel area 11.

Specifically, light incident on the on-chip lens 37 corresponding to each pixel needs to be incident on the photodiode 32 constituting the pixel via the corresponding color filter 35. In view of the above, generally, the positions of the color filter 35 and the on-chip lens 37 corresponding to one of the photodiodes 32 are displaced toward the direction of a thick arrow shown in the pixel area 11 in FIG. 1, i.e., center O of the pixel area 11, with respect to the corresponding pixel depending on the distance from the center O of the pixel area 11, and thus pupil correction is performed. The distance in which the color filter 35 and the on-chip lens 37 are displaced toward the center O of the pixel area 11 by the pupil correction is referred to as a pupil correction amount.

Meanwhile, the film thickness of the pixel area 11 may have unevenness due to the thing arranged in the non-pixel area 12 provided adjacent to the pixel area 11, depending on, for example, the viscosity or the like of the material applied as the upper layer film, in the process. Here, the unevenness is a difference between the film thickness of the upper layer film at the center O of the pixel area 11 and the film thickness of the upper layer film at a predetermined position of the pixel area 11.

Specifically, as shown in FIG. 2, the film thickness of the upper layer film (insulating film 36) is increased from the center side of the pixel area 11 toward the peripheral side (side of the non-pixel area 12), and as shown in FIG. 3, the film thickness of the upper layer film (insulating film 36) is decreased from the center side of the pixel area 11 toward the peripheral side (side of the non-pixel area 12). In the following, the shape of the unevenness shown in FIG. 2 is referred to as concave portion, and the shape of the unevenness shown in FIG. 3 is referred to as convex portion.

It should be noted that examples of the thing arranged in the non-pixel area 12, which differentiates the film thickness of the upper layer film, i.e., factor of the unevenness, include an OPB (Optical Black) pixel, a through hole via, an electrode pad, and a wiring.

The unevenness of the film thickness of the upper layer film generated in the pixel area 11 in this way varies depending on the distance from the non-pixel area 12 (factor of the unevenness) in the pixel area 11. Therefore, in the case where the film thickness of the upper layer film has the unevenness in the pixel area 11, pupil correction needs to be performed depending on the distance from the center O of the pixel area 11, and depending on the film thickness of the upper layer film at the respective positions.

In view of the above, the pupil correction in the present disclosure changes the pupil correction amount of the on-chip lens 37 depending on, for example, the distance between the center O of the pixel area 11 and the on-chip lens 37, and depending on the film thickness of the upper layer film at the position of the on-chip lens 37 on the upper layer film.

Figure 4:
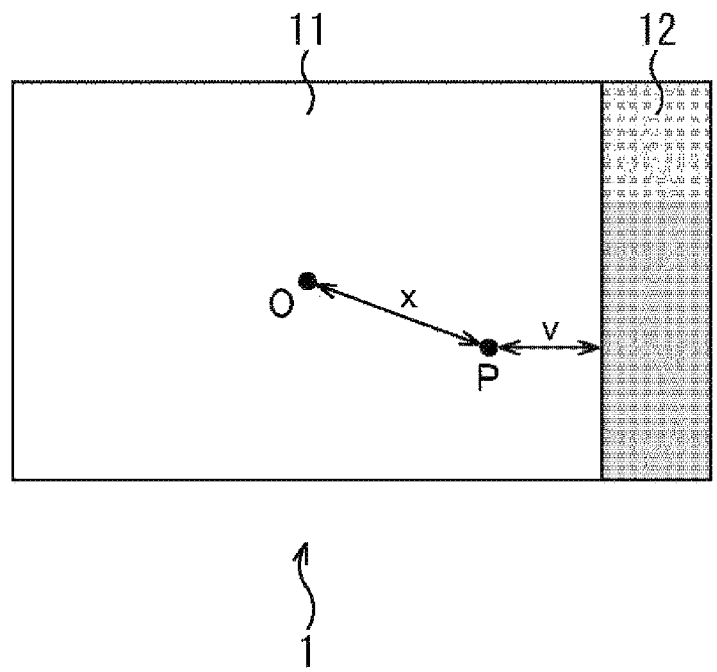
FIG. 4 is a diagram for explaining pupil correction in the present disclosure.

It should be noted that as described above, the film thickness of the upper layer film varies depending on the distance from the non-pixel area 12 on the pixel area 11. Specifically, as shown in FIG. 4, the pupil correction in the present disclosure changes the pupil correction amount of the on-chip lens 37 depending on a distance x between the center O of the pixel area 11 and a position P of the on-chip lens 37 in the pixel area 11, and depending on a distance v between the non-pixel area 12 and the position p.

Hereinafter, the pupil correction in the present disclosure will be described in more detail.

[Detail of Pupil Correction in Present Disclosure]

Figure 5:
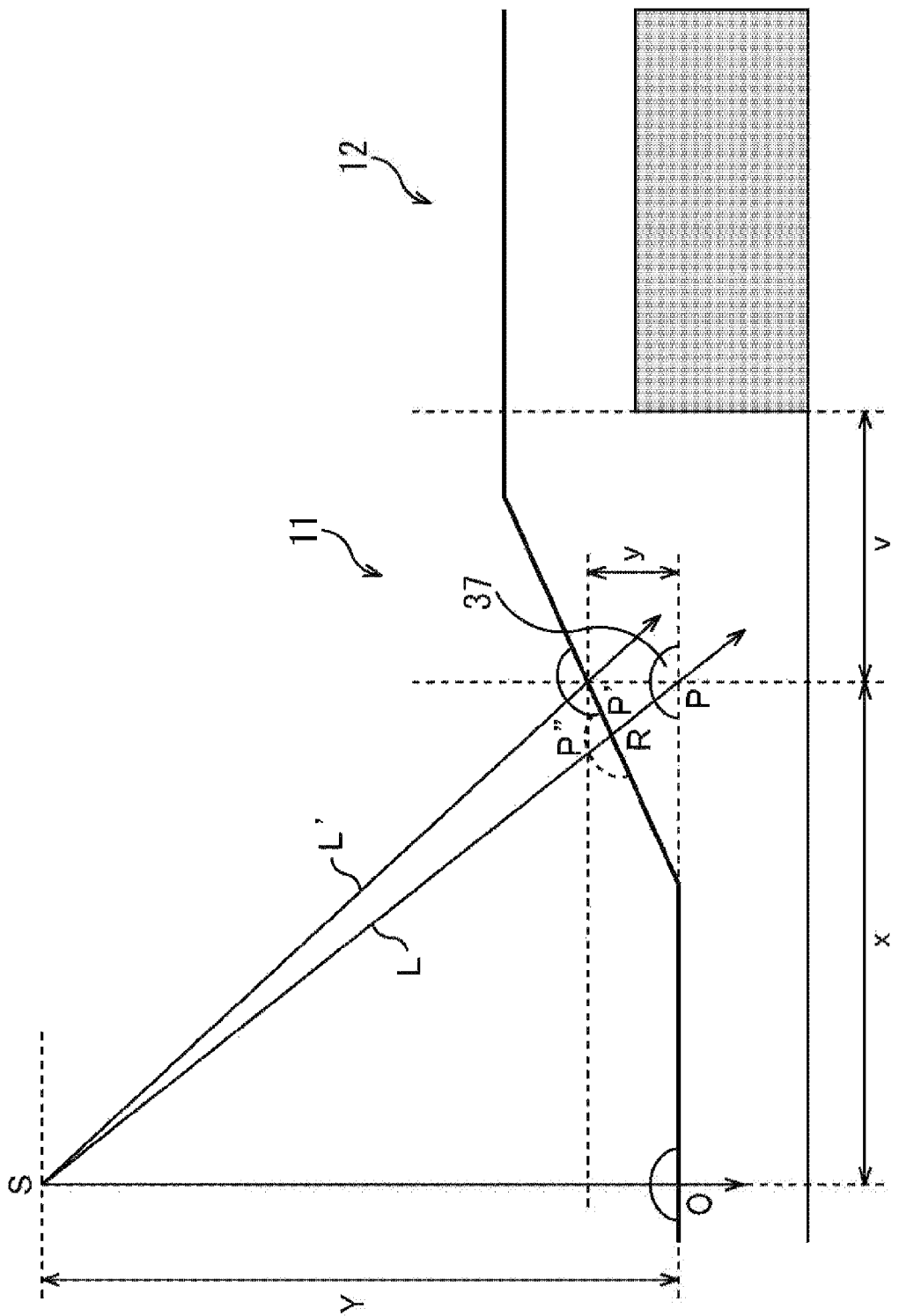
FIG. 5 is a diagram for explaining the pupil correction in the present disclosure.

FIG. 5 is a cross-sectional view of the pixel area 11 and the non-pixel area 12 of the CMOS image sensor 1, for explaining the detail of the pupil correction in the present disclosure.

As shown in FIG. 5, a distance between a point S in an optical axis of an optical lens (not shown) serving as a light source and the center O of the pixel area 11 is referred to as Y. Moreover, the position on the on-chip lens 37 on a flat surface having the same film thickness as that of the upper layer film at the center O of the pixel area 11, which corresponds to a pixel to be focused (focused pixel) is referred to as P, and the position of the on-chip lens 37 on the upper layer film is referred to as P' taking into account of an unevenness y of the film thickness of the upper layer film at the position P.

In the existing pupil correction, in the case where the unevenness y of the film thickness of the upper layer is not existed, the on-chip lens 37 corresponding to the focused pixel is arranged at the position P displaced from the position of the focused pixel by a predetermined pupil correction amount so that a light beam L entered from the optical lens is incident on the focused pixel. However, in the case where the existing pupil correction is applied to the pixel area 11 including the unevenness y in the film thickness of the upper layer film, the on-chip lens 37 is arranged at the position P', and a light beam L' different from the light beam L is incident on the focused pixel corresponding to the on-chip lens 37.

In view of the above, in the case where the film thickness of the upper layer film in the pixel area 11 has the unevenness y, the on-chip lens 37 only has to be arranged at a position P''' in order to cause the light beam L entered from the optical lens to be incident on the focused pixel. It should be noted that strictly, the on-chip lens 37 is arranged at an intersection point R of the light beam L and the surface of the upper layer film. However, because the distance between the intersection point R and the position P''' is very small, the intersection point R is regarded to be the same as the position P'''.

Figure 6:
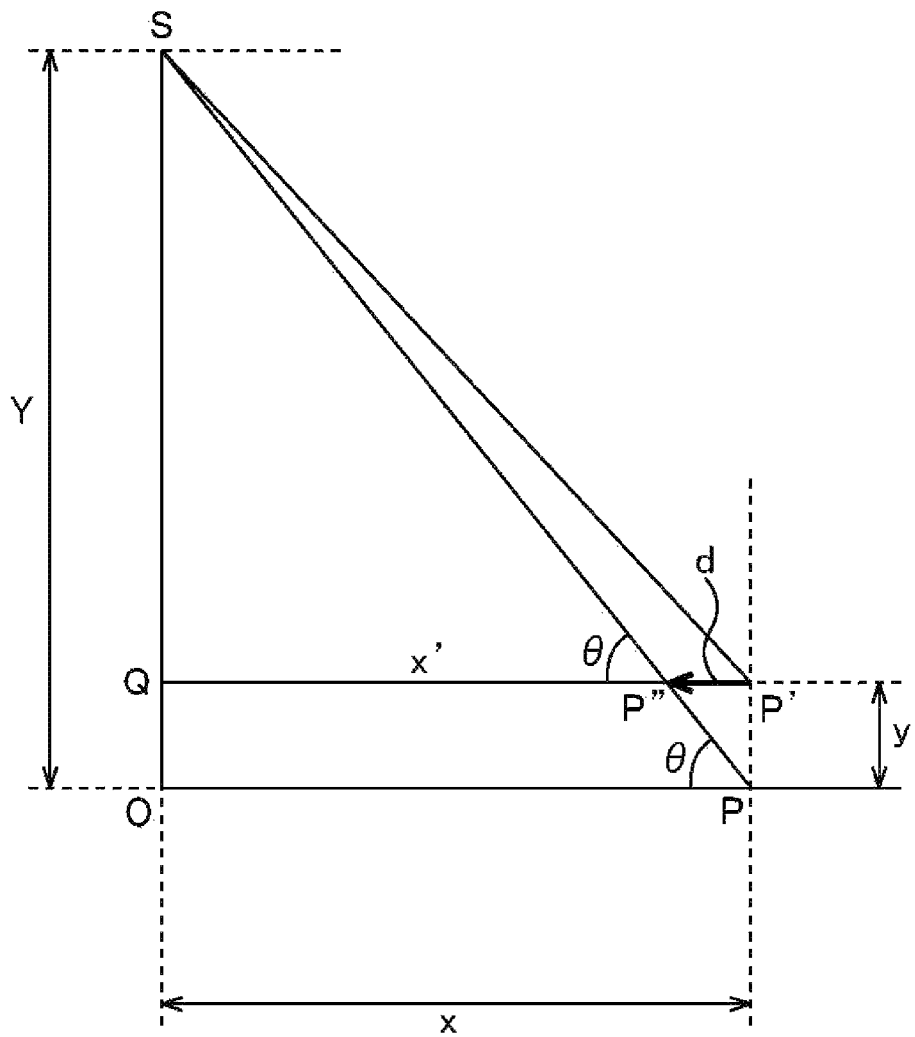
FIG. 6 is a diagram for explaining the pupil correction in the present disclosure.

Specifically, as shown in FIG. 6, the pupil correction amount of the on-chip lens 37 is a distance of the existing pupil correction amount added to a distance d between the position P' and the position P'''.

Here, in FIG. 6, if a point of a height of the unevenness y from the center O of the pixel area 11 on an optical axis of an optical lens is referred to as Q and the length of a line segment QP''' is referred to as x', the distance d is represented by the following formula (1).

$$d = x - x' \qquad (1)$$

Moreover, in the case where the relationship $\angle OPS = \angle QP'''S = \theta$ is established, the following formula (2) is established.

$$\tan \theta = Y/x = (Y-y)/x' \qquad (2)$$

From the formula (2), x' is represented by the following formula (3).

$$x' = x(Y-y)/Y \qquad (3)$$

From the formula (1) and the formula (3), the distance d is represented by the formula (4).

$$d = x\{1 - (Y-y)/Y\} = xy/Y \qquad (4)$$

As shown in the formula (4), the distance d is determined by the distance x between the center O of the pixel area 11 and the position P of the on-chip lens 37 (position P'), and by the unevenness y of the film thickness of the upper layer film at the position P. Specifically, the pupil correction amount of the on-chip lens 37 varies depending on the distance x between the center O of the pixel area 11 and the on-chip lens 37, and depending on the unevenness y of the film thickness of the upper layer film at the position of the on-chip lens 37 on the upper layer film.

Moreover, as described above, the unevenness y of the film thickness of the upper layer film is determined by the distance v between the non-pixel area 12 and the position P. Specifically, the pupil correction amount of the on-chip lens 37 varies depending on the distance x between the center O of the pixel area 11 and the on-chip lens 37, and depending on the distance v between the non-pixel area 12 and the on-chip lens 37.

Figure 7:
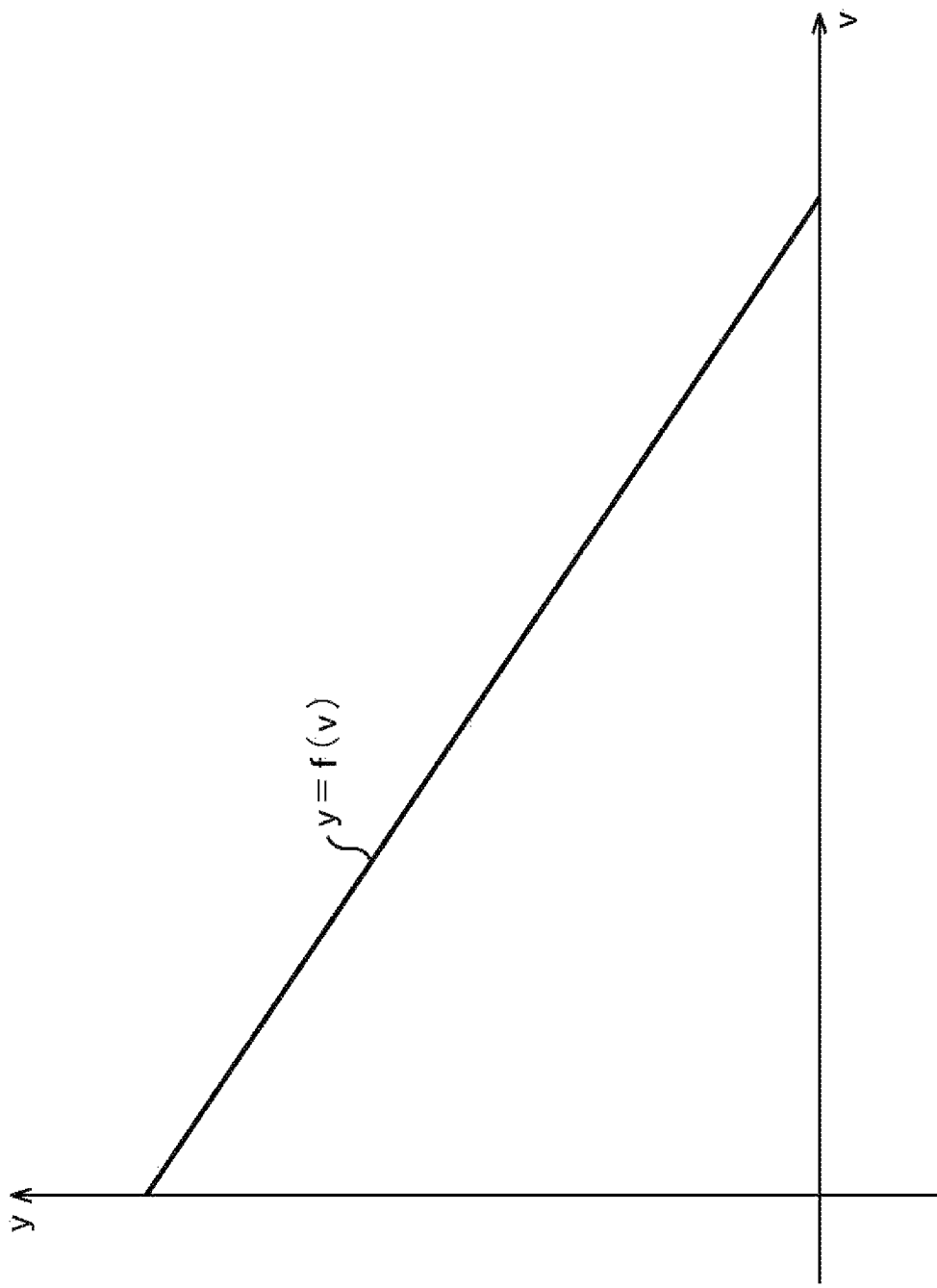
FIG. 7 is a diagram showing an example of a function representing a film thickness of an upper layer film.
Figure 8:
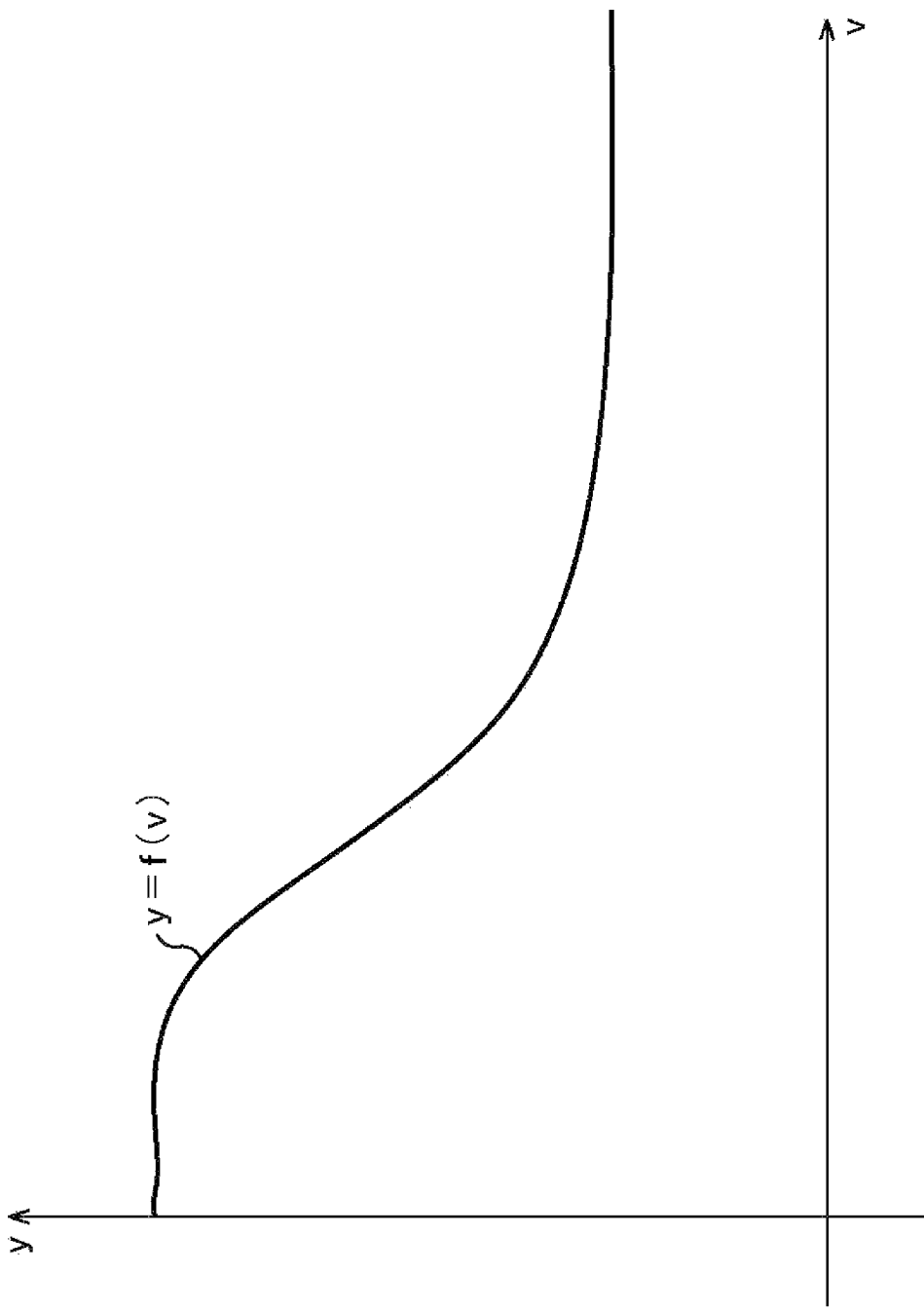
FIG. 8 is a diagram showing an example of the function representing the film thickness of the upper layer film.

Here, for example, as shown in FIG. 7, the unevenness y of the film thickness of the upper layer is represented by a linear function of the distance v between the non-pixel area 12 and the position P. Moreover, as shown in FIG. 8, the unevenness y of the film thickness of the upper layer may be represented by a non-linear function of the distance v between the non-pixel area 12 and the position P.

Moreover, the function representing the unevenness y of the film thickness of the upper layer film is set in advance by, for example, three-dimensionally analyzing the shape of the upper surface of the upper layer film. Furthermore, the function representing the unevenness y of the film thickness of the upper layer varies depending on the factor of the unevenness arranged in the non-pixel area 12. Specifically, the shape of the unevenness y of the film thickness of the upper layer film is changed to the concave shape or convex shape depending on the factor of the unevenness arranged in the non-pixel area 12.

With the above-mentioned configuration in which the pupil correction amount of the on-chip lens 37 is changed depending on the distance between the center O of the pixel area 11 and the on-chip lens 37, and depending on the film thickness of the upper layer film at the position of the on-chip lens 37 on the upper layer film, it is possible to more reliably improve shading characteristics even if the film thickness of the upper layer film varies due to some causes in the process.

Moreover, in the past, by providing sufficient space (invalid area) between the pixel area 11 and a thing serving as the factor of the unevenness provided in the non-pixel area 12 so as not to generate the unevenness of the film thickness of the upper layer film in the pixel area 11, the pupil correction is not affected by the unevenness of the film thickness of the upper layer.

On the other hand, according to the pupil correction in the present disclosure, it is possible to improve shading characteristics, taking into account of the unevenness of the film thickness of the upper layer film in the pixel area 11. Therefore, it is possible to reduce the size of the invalid area, and to further reduce the chip size of the CMOS image sensor 1.

It should be noted that in the above, although the derivation of the distance d in the case where the shape of the unevenness y of the film thickness of the upper layer film is the concave shape has been described, the derivation of the distance d in the case where the shape of the unevenness y of the film thickness of the upper layer film is the convex shape can be performed in the same way. It should be noted that in the case where the shape of the unevenness y of the film thickness of the upper layer film is the concave shape, the on-chip lens 37 is displaced from the original position of the pupil correction toward the center O of the pixel area 11. However, in the case where the shape of the unevenness y of the film thickness of the upper layer film is the convex shape, the on-chip lens 37 is displaced from the original position of the pupil correction toward the opposite side of the center O of the pixel area 11.

Furthermore, the pupil correction amount derived in this way can be applied to the color filters 35 formed so as to correspond to the respective pixels and a light-shielding film (not shown) formed to prevent color mixture among the color filters, as in the case of the on-chip lens 37.

Moreover, in the above, although the configuration in which the non-pixel area 12 having the factor of the unevenness is provided adjacent to one side of the right side of the pixel area 11 has been described, the non-pixel area 12 may be provided adjacent to another side of the pixel area 11. Furthermore, the non-pixel area 12 is not limited to the one provided adjacent to only any side of the pixel area 11.

In the following, another embodiment of the solid-state imaging apparatus to which the present disclosure is applied will be described.

[Another Embodiment of Solid-State Imaging Apparatus]

Figure 9:
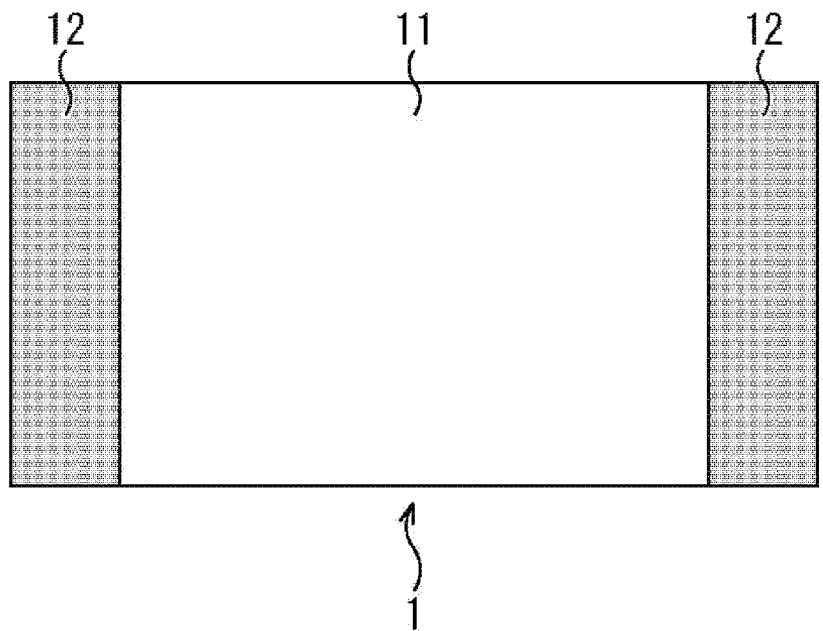
FIG. 9 is a diagram showing another example of the solid-state imaging apparatus to which the present disclosure is applied.

FIG. 9 is a plan view showing the configuration of another embodiment of the solid-state imaging apparatus to which the present disclosure is applied.

In the CMOS image sensor 1 shown in FIG. 9, the non-pixel area 12 is provided adjacent to two sides (right and left sides in FIG. 9) of the pixel area 11. It should be noted that the non-pixel area 12 may be provided adjacent to other two sides of the pixel area 11.

In the configuration shown in FIG. 9, examples of a thing to be the factor of the unevenness of the film thickness of the upper layer film in the pixel area 11, which is arranged in the non-pixel area 12, include an OPB pixel, a through hole via, an electrode pad, and a wiring.

Figure 10:
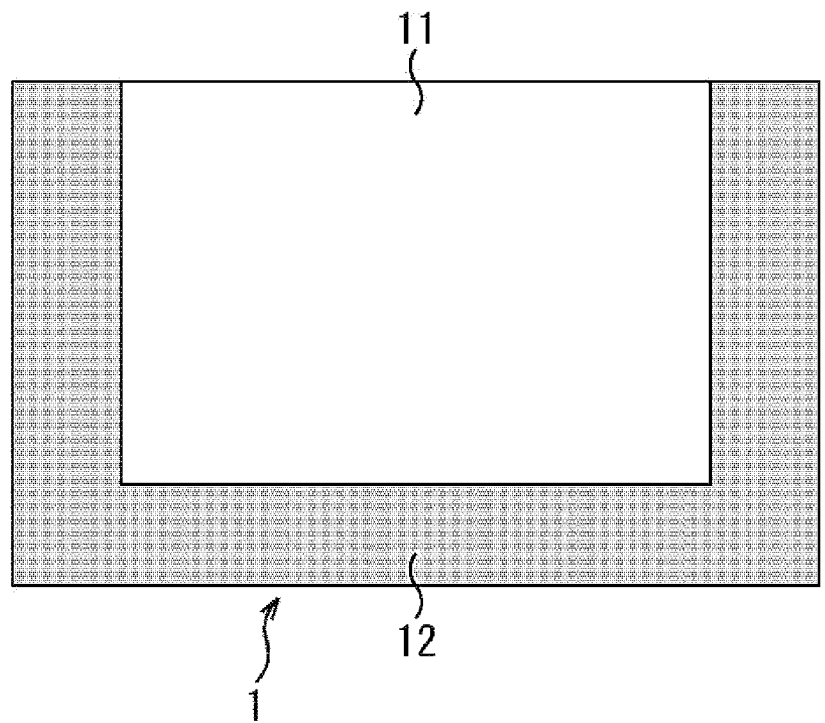
FIG. 10 is a diagram showing still another example of the solid-state imaging apparatus to which the present disclosure is applied.

FIG. 10 is a plan view showing the configuration of still another embodiment of the solid-state imaging apparatus to which the present disclosure is applied.

In the CMOS image sensor 1 shown in FIG. 10, the non-pixel area 12 is provided adjacent to three sides (right, left, and lower sides in FIG. 10) of the pixel area 11. It should be noted that the non-pixel area 12 may be provided adjacent to other three sides of the pixel area 11.

In the configuration shown in FIG. 10, examples of a thing to be the factor of the unevenness of the film thickness of the upper layer film in the pixel area 11, which is arranged in the non-pixel area 12, include an OPB pixel, a through hole via, an electrode pad, and a wiring.

Figure 11:
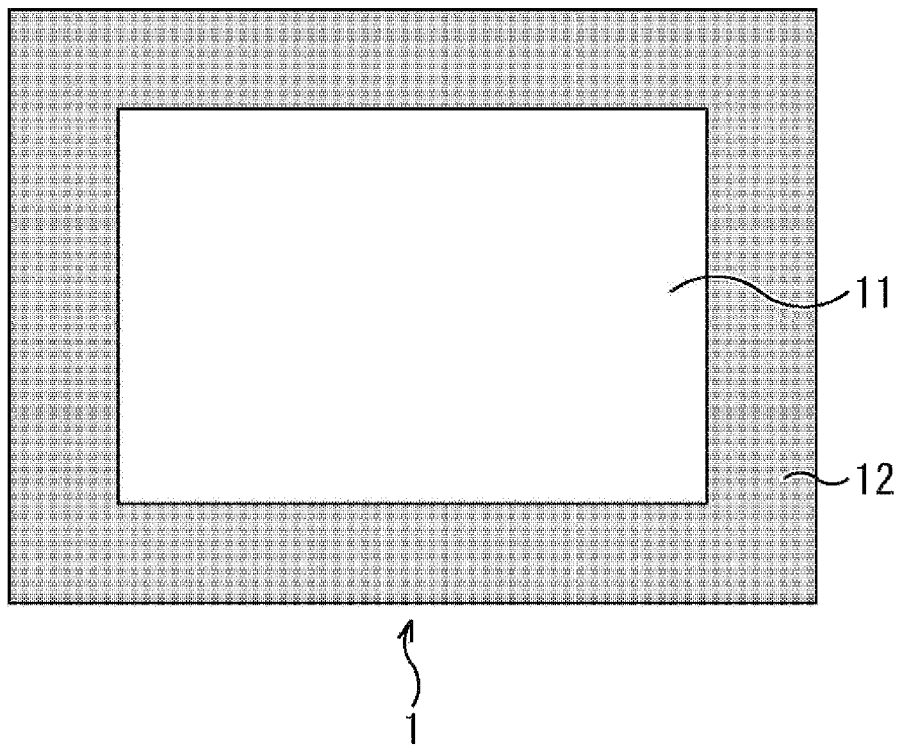
FIG. 11 is a diagram showing still another example of the solid-state imaging apparatus to which the present disclosure is applied.
Figure 12:
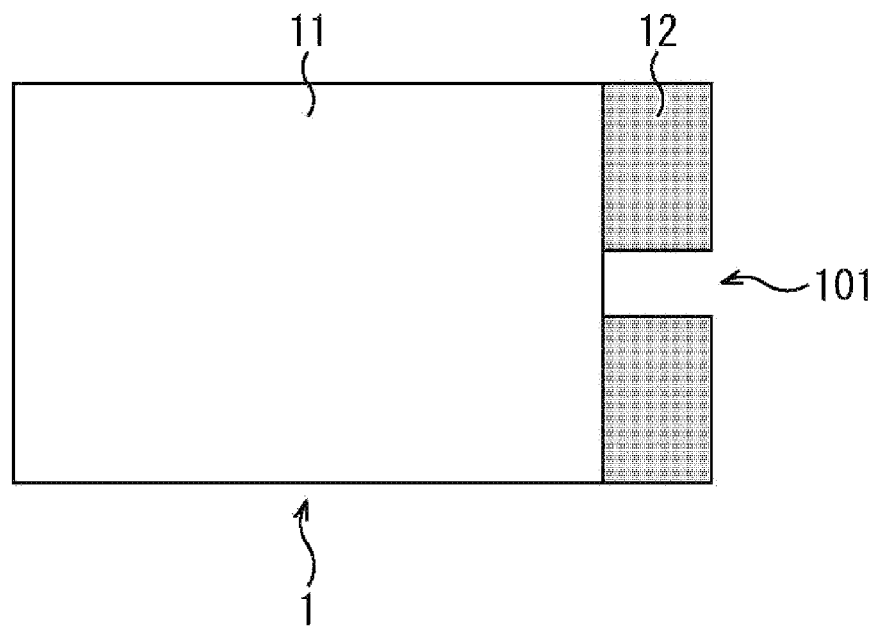
FIG. 12 is a diagram showing still another example of the solid-state imaging apparatus to which the present disclosure is applied.
Figure 13:
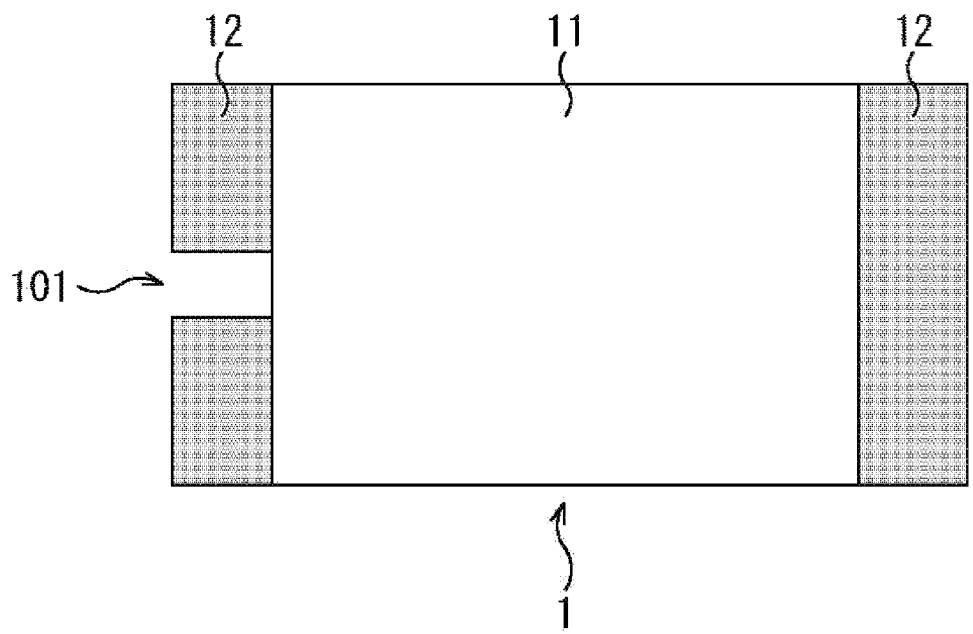
FIG. 13 is a diagram showing still another example of the solid-state imaging apparatus to which the present disclosure is applied.
Figure 14:
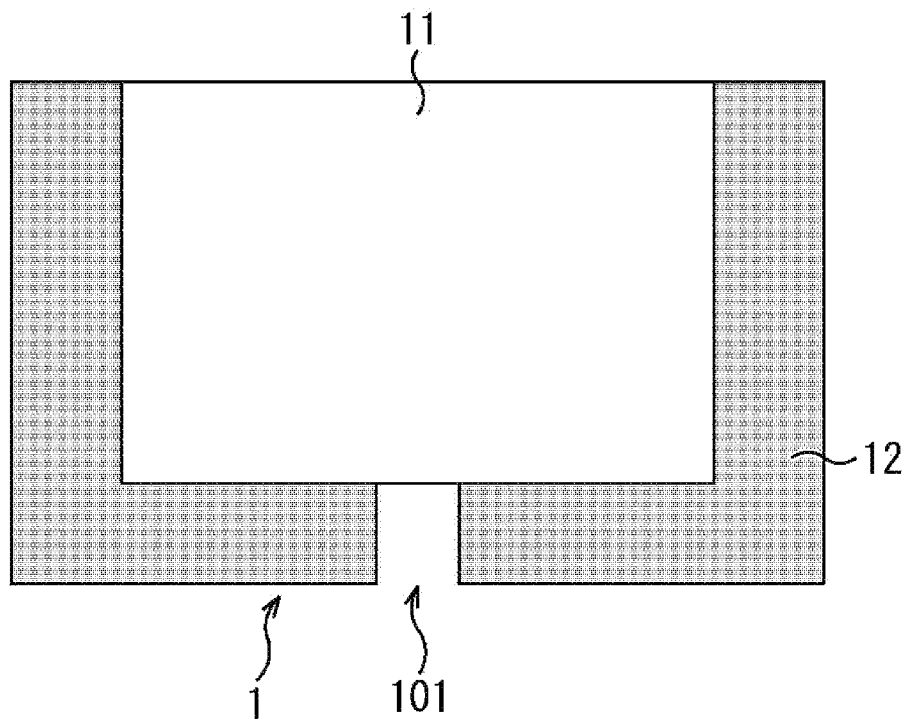
FIG. 14 is a diagram showing still another example of the solid-state imaging apparatus to which the present disclosure is applied.
Figure 15:
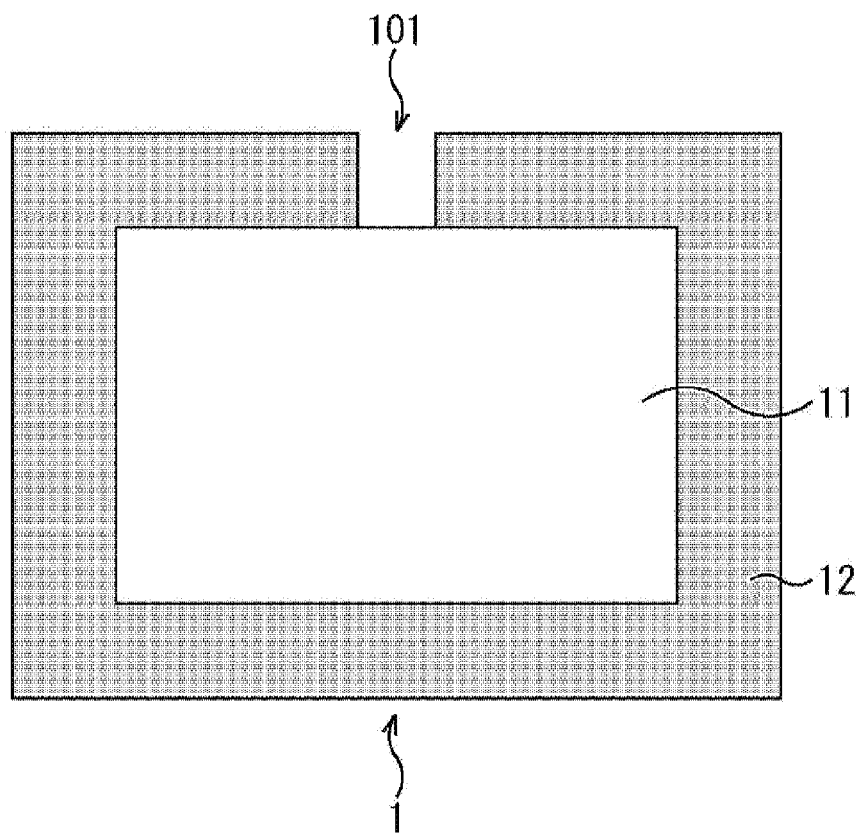
FIG. 15 is a diagram showing still another example of the solid-state imaging apparatus to which the present disclosure is applied.

FIG. 11 is a plan view showing the configuration of still another embodiment of the solid-state imaging apparatus to which the present disclosure is applied.

In the CMOS image sensor 1 shown in FIG. 11, the non-pixel area 12 is provided adjacent to four sides of the pixel area 11.

In the configuration shown in FIG. 11, examples of a thing to be the factor of the unevenness of the film thickness of the upper layer film in the pixel area 11, which is arranged in the non-pixel area 12, include an OPB pixel, a through hole via, an electrode pad, a wiring, and a scribe line.

In particular, in the configuration shown in FIG. 11, in the case where the shape of the unevenness of the film thickness of the upper layer film in the pixel area 11 is the concave shape, examples of a thing to be the factor of the unevenness include the configuration in which the pixel area 11 is lower (lower in height) than the non-pixel area 12.

Moreover, in the configuration shown in FIG. 11, also the color filter 35 applied in the pixel area 11 is in itself the factor of the unevenness in the case of the concave shape due to, for example, the wettability.

It should be noted that the non-pixel area 12 provided adjacent to any side of the pixel area 11, as shown in FIG. 1 and FIGS. 9 to 11, may have a gap due to the necessity for designing e.g., arrangement of the through hole via or the electrode pad.

Specifically, as shown in FIGS. 12 to 15, in a part of the non-pixel area 12 shown in FIG. 1 and FIGS. 9 to 11, a gap 101 may be provided.

In the configuration shown in FIGS. 12 to 15, examples of a thing to be the factor of the unevenness of the film thickness of the upper layer film in the pixel area 11, which is arranged in the non-pixel area 12, include an OPB pixel, a through hole via, an electrode pad, and a wiring.

It should be noted that in the configuration shown in FIGS. 12 to 15, the unevenness of the film thickness of the upper layer film in a predetermined position of the pixel area 11 is represented by a function of a distance from the non-pixel area 12 and by a function of a distance from the gap 101.

Figure 16:
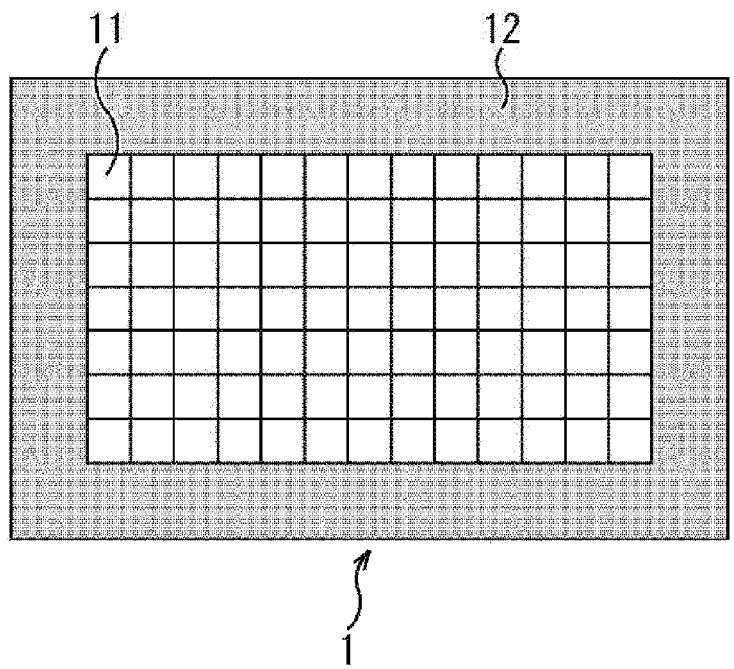
FIG. 16 is a diagram showing still another example of the solid-state imaging apparatus to which the present disclosure is applied.

Furthermore, as shown in FIG. 16, in the case where the pixel area 11 is divided into a plurality of pixel blocks in the configuration shown in FIG. 11, metal arranged in a lattice shape to divide the pixel area 11 is the factor of the unevenness of the film thickness of the upper layer film in the pixel area 11 in the process. In this case, on the metal arranged in the pixel area 11, the material of the upper layer film is applied. As a result, for each pixel block formed in the pixel area 11, the unevenness of the film thickness of the upper layer film is generated.

Figure 17:
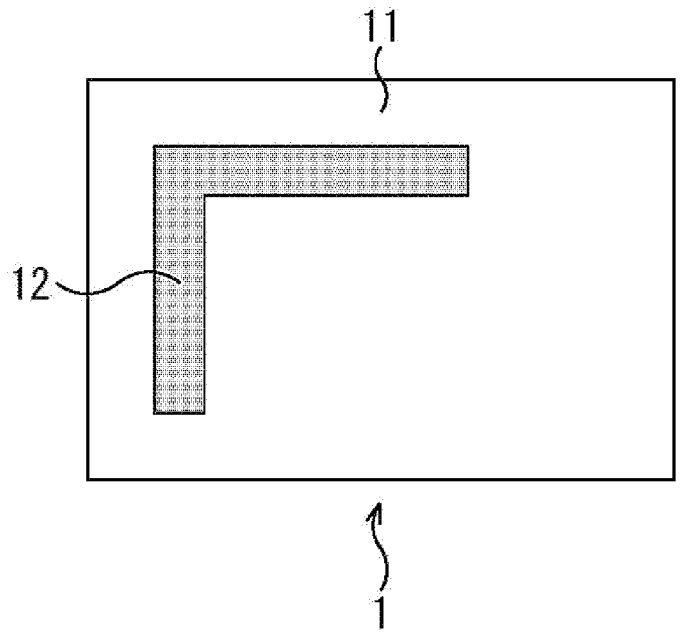
FIG. 17 is a diagram showing still another example of the solid-state imaging apparatus to which the present disclosure is applied.

Moreover, in the above description, the non-pixel area 12 is basically provided outside of the pixel area 11. However, as shown in FIG. 17, the non-pixel area 12 may be provided inside the pixel area 11. It should be noted that the shape of the non-pixel area 12 is not limited to the shape shown in FIG. 17.

In the above, the configuration of the CMOS image sensor 1 has been described. In the following, the process of forming the CMOS image sensor 1 will be described.

[Process of Forming Solid-State Imaging Apparatus]

Figure 18:
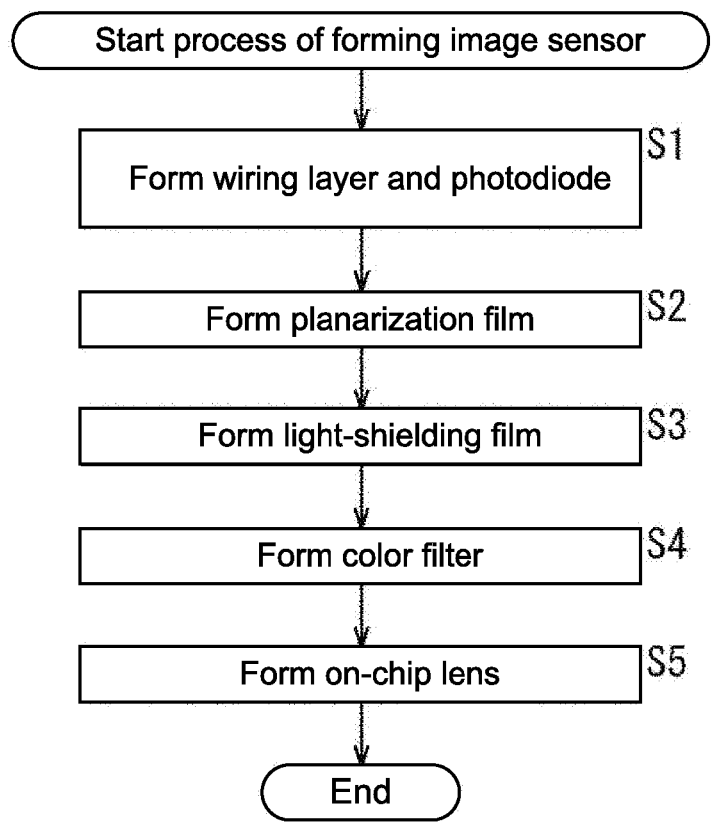
FIG. 18 is a flowchart for explaining a process of forming the solid-state imaging apparatus.

FIG. 18 is a flowchart for explaining a process of forming the CMOS image sensor 1 to which the present disclosure is applied.

It should be noted that in the flowchart shown in FIG. 18, because processes prior to Step S1 and processes subsequent to Step S5 are the same as those generally performed in the process of forming a solid-state imaging apparatus, and a description thereof will be omitted.

In Step S1, a wiring layer and a photodiode are formed.

Figure 19A:
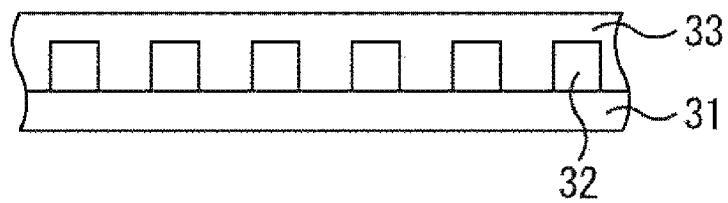
FIGS. 19A-19E are diagrams for explaining the flow of the process of forming the solid-state imaging apparatus.

Specifically, as shown in FIG. 19A, the wiring layer 31 is formed on a supporting substrate (not shown), and the semiconductor substrate 33 in which the photodiodes 32 serving as a plurality of pixels are formed is formed on the wiring layer 31.

Figure 19B:
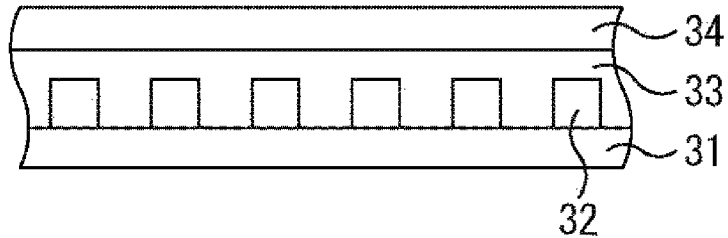

In Step S2, as shown in FIG. 19B, the planarization film 34 is formed on the upper surface of the semiconductor substrate 33.

Figure 19C:
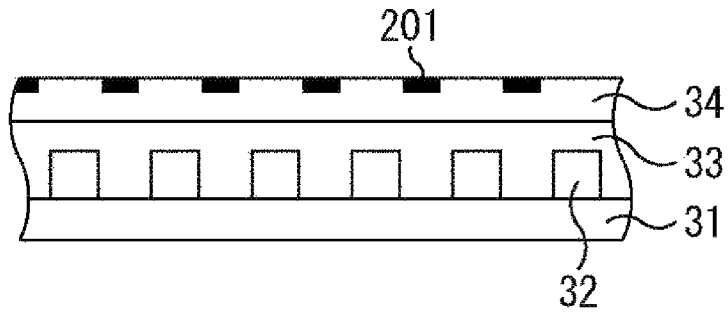

In Step S3, a light-shielding film is formed. Specifically, as shown in FIG. 19C, on the upper surface of the planarization film 34, light-shielding films 201 for preventing color mixture among the color filters 35 are formed so as to correspond to the respective photodiodes 32. At this time, the pupil correction amount of the light-shielding film 201 is changed depending on the distance from the center of the pixel area 11, and depending on the film thickness of the planarization film 34 at the position thereof.

Figure 19D:
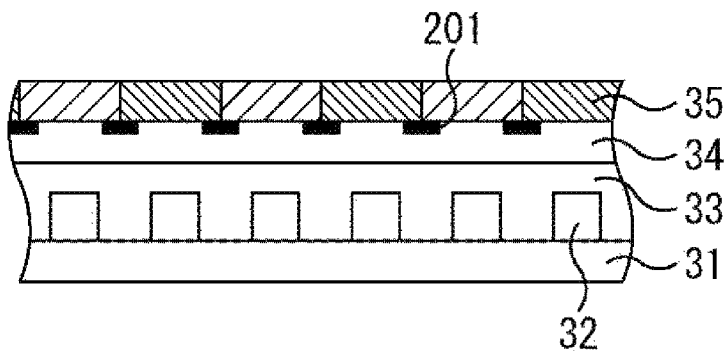

In Step S4, the color filters are formed. Specifically, as shown in FIG. 19D, on the upper surface of the planarization film 34, the color filters 35 are formed so as to correspond to the respective photodiodes 32. At this time, the pupil correction amount of the color filter 35 is changed depending on the distance from the center of the pixel area 11, and depending on the film thickness of the planarization film 34 at the position thereof.

Figure 19E:
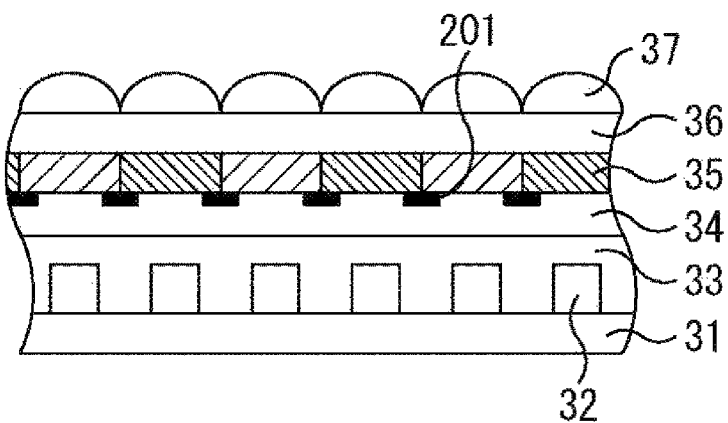

In Step S5, the on-chip lens is formed. Specifically, as shown in FIG. 19E, the insulating film 36 is formed on the upper surface of the color filters 35, and the on-chip lenses 37 are formed on the upper surface of the insulating film 36 so as to correspond to the respective photodiodes 32. At this time, the pupil correction amount of the on-chip lens 37 is changed depending on the distance from the center of the pixel area 11, and depending on the film thickness of the planarization film 34 to the insulating film 36 at the position thereof.

In the above processes, the pupil correction amount of the on-chip lens 37 is changed depending on the distance between the center O of the pixel area 11 and the on-chip lens 37, and depending on the film thickness of the upper layer at the position of the on-chip lens 37 on the upper layer film. Therefore, it is possible to more reliably improve shading characteristics even if the film thickness of the upper layer film varies due to some causes in the process.

It should be noted that in the above, an example in which the present disclosure is applied to the rear-surface irradiation type CMOS image sensor 1 has been described. However, the present disclosure can be applied to a front-surface irradiation type CMOS image sensor.

Figure 20:
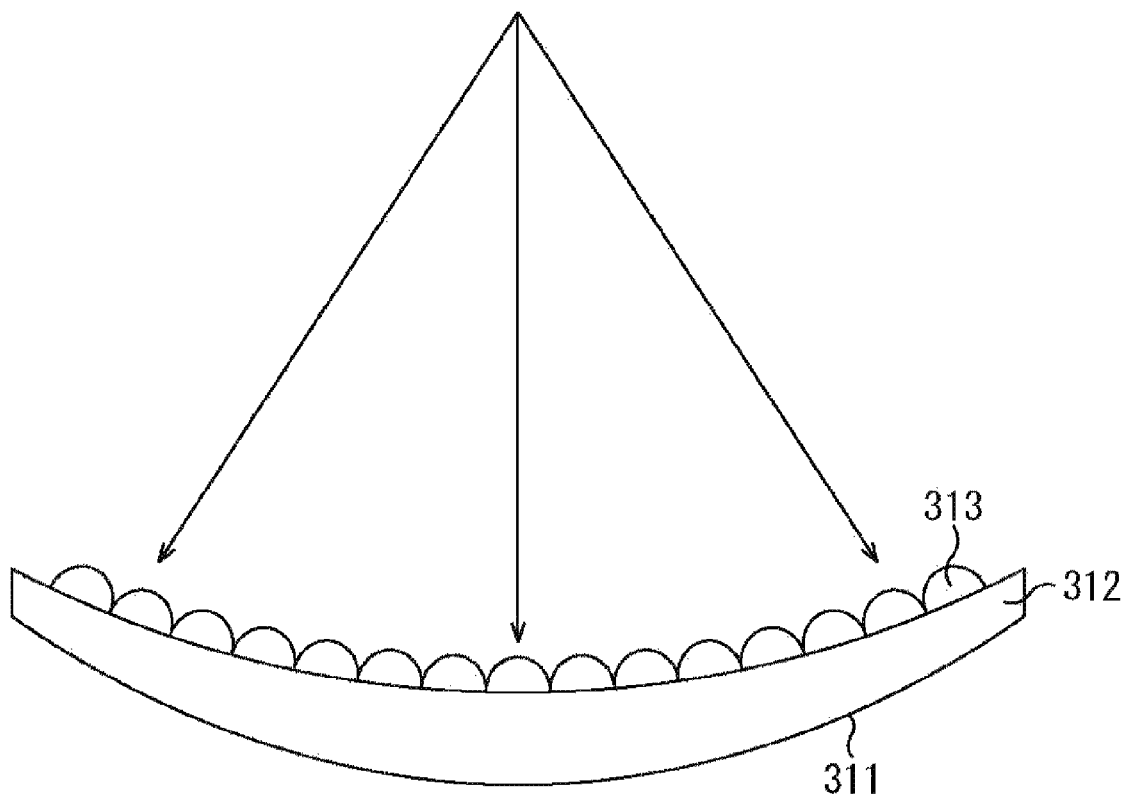
FIG. 20 is a diagram showing still another example of the solid-state imaging apparatus to which the present disclosure is applied.

Moreover, as shown in FIG. 20, the present disclosure can be also applied to a solid-state imaging apparatus in which a light-receiving surface 311 is curved, an upper layer film 312 is formed on the light-receiving surface 311, and on-chip lenses 313 are formed along the upper surface of the upper layer film 312. In the configuration shown in FIG. 20, the film thickness of the upper layer film 312 increases toward the center of the pixel area, and the shape of the unevenness of the film thickness of the upper layer film 312 is the concave shape.

[Configuration Example of Electronic Apparatus to which Present Disclosure is Applied]

Furthermore, the present disclosure is not limited to be applied to a solid-state imaging apparatus. Specifically, the present disclosure can be applied to an electronic apparatus using a solid-state imaging apparatus as an image capturing unit (photoelectric conversion unit) in general, e.g., an imaging apparatus such as a digital still camera and a video camera, a portable terminal having an imaging function, and a copier using a solid-state imaging apparatus as an image reading unit. The solid-state imaging apparatus may be formed in the form of one chip, or may be formed in the form of module having an imaging function in which an imaging unit, and a signal processing unit or an optical system are collectively packaged.

Figure 21:
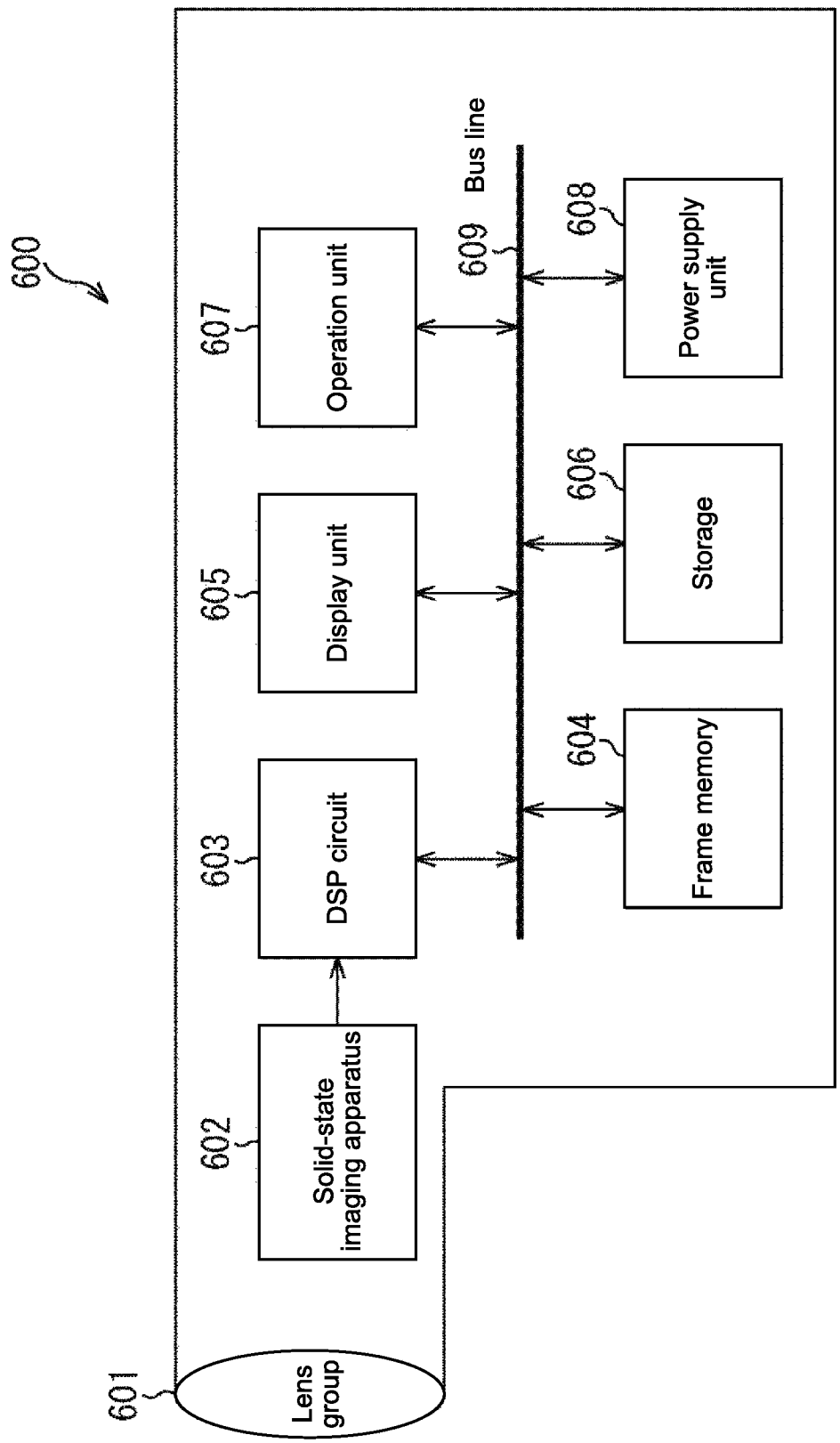
FIG. 21 is a diagram showing a configuration example of an embodiment of an electronic apparatus to which the present disclosure is applied.

FIG. 21 is a block diagram showing a configuration example of an imaging apparatus serving as an electronic apparatus to which the present disclosure is applied.

An imaging apparatus 600 shown in FIG. 21 includes an optical section 601 including a lens group and the like, a solid-state imaging apparatus (imaging device) 602 in which the respective configurations of the shared pixel described above are employed, and a DSP (digital signal processing) circuit 603 serving as a camera signal processing circuit. Moreover, the imaging apparatus 600 further includes a frame memory 604, a display unit 605, a storage 606, an operation unit 607, and a power supply unit 608. The DSP circuit 603, the frame memory 604, the display unit 605, the storage 606, the operation unit 607, and the power supply unit 608 are connected to one another via a bus line 609.

The optical section 601 captures incident light (image light) from an object, and forms an image on the imaging surface of the solid-state imaging apparatus 602. The solid-state imaging apparatus 602 converts the light amount of incident light imaged on the imaging surface by the optical section 601 into an electric signal on a pixel-by-pixel basis and outputs it as a pixel signal. As the solid-state imaging apparatus 602, the CMOS image sensor 1 according to the embodiment described above can be used.

The display unit 605 includes, for example, a panel display apparatus including a liquid crystal panel and an organic EL (Electro Luminescence) panel, and displays a movie or a still image captured by the solid-state imaging apparatus 602. The storage 606 stores the movie or the still image captured by the solid-state imaging apparatus 602 in a recording medium such as a DVD (Digital Versatile Disk).

The operation unit 607 issues an operation command for various functions of the imaging apparatus 600 under the user's operation. The power supply unit 608 appropriately supplies various power supplies serving as operation power supplies of the DSP circuit 603, the frame memory 604, the display unit 605, the storage 606, and the operation unit 607 to these supply targets.

As described above, by using the CMOS image sensor 1 according to the embodiment described above as the solid-state imaging apparatus 602, the pupil correction amount of the on-chip lens can be changed depending on the distance between the center of the pixel area and the on-chip lens, and depending on the unevenness of the film thickness of the upper layer film at the position of the on-chip lens on the upper layer film. Therefore, in the imaging apparatus 600, e.g., a camera module for a mobile apparatus such as a video camera, a digital still camera, and a cellular phone, it is possible to more reliably improve shading characteristics and to prevent the image quality of the image from being degraded.

It should be noted that embodiments of the present disclosure are not limited to the above-mentioned embodiments and various modifications can be made without departing from the gist of the present disclosure.

Furthermore, the present disclosure may also take the following configurations.

(1) A solid-state imaging apparatus, including:
a semiconductor substrate on which a plurality of pixels are formed;
an upper layer film laminated on the semiconductor substrate; and
on-chip lenses formed on the upper layer film so as to correspond to the respective pixels, a pupil correction amount of one of the on-chip lenses being changed depending on a distance between a center of a pixel area and the on-chip lens, and depending on a film thickness of the upper layer film at a position of the on-chip lens on the upper layer film.

(2) The solid-state imaging apparatus according to (1), in which
the film thickness of the upper layer film is represented by a function of a distance from a factor differentiating the film thickness of the upper layer film.

(3) The solid-state imaging apparatus according to (2), in which
the function is a linear function.

(4) The solid-state imaging apparatus according to (2), in which
the function is a non-linear function.

(5) The solid-state imaging apparatus according to any one of (2) to (4), in which
the upper layer film includes color filters formed so as to correspond to the respective pixels, and
a pupil correction amount of one of the color filters is changed depending on a distance between the center of the pixel area and the color filter, and depending on a film thickness of the upper layer film at a position of the color filter on the upper layer film.

(6) The solid-state imaging apparatus according to any one of (2) to (5), in which
the upper layer film includes light-shielding films formed so as to correspond to the respective pixels, and
a pupil correction amount of one of the light-shielding films is changed depending on a distance between the center of the pixel area and the light-shielding film, and depending on a film thickness of the upper layer film at a position of the light-shielding film on the upper layer film.

(7) The solid-state imaging apparatus according to any one of (1) to (6), in which
the factor differentiating the film thickness of the upper layer film is OPB (Optical Black) pixel.

(8) The solid-state imaging apparatus according to any one of (1) to (6), in which
the factor differentiating the film thickness of the upper layer film is a through hole via.

(9) The solid-state imaging apparatus according to any one of (1) to (6), in which
the factor differentiating the film thickness of the upper layer film is an electrode pad.

(10) The solid-state imaging apparatus according to any one of (1) to (6), in which
the factor differentiating the film thickness of the upper layer film is a wiring.

(11) The solid-state imaging apparatus according to any one of (1) to (6), in which
the factor differentiating the film thickness of the upper layer film is a scribe line.

(12) A method of producing a solid-state imaging apparatus including a semiconductor substrate on which a plurality of pixels are formed, an upper layer film laminated on the semiconductor substrate, and on-chip lenses formed on the upper layer film so as to correspond to the respective pixels, including
forming the on-chip lenses by changing a pupil correction amount of one of the on-chip lenses depending on a distance between a center of a pixel area and the on-chip lens, and depending on a film thickness of the upper layer film at a position of the on-chip lens on the upper layer film.

(13) An electronic apparatus, including
a solid-state imaging apparatus including
a semiconductor substrate on which a plurality of pixels are formed,
an upper layer film laminated on the semiconductor substrate, and
on-chip lenses formed on the upper layer film so as to correspond to the respective pixels, a pupil correction amount of one of the on-chip lenses being changed depending on a distance between a center of a pixel area and the on-chip lens, and depending on a film thickness of the upper layer film at a position of the on-chip lens on the upper layer film.

The present disclosure contains subject matter related to that disclosed in Japanese Priority Patent Application JP 2012-219035 filed in the Japan Patent Office on Oct. 1, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging apparatus, comprising:
a semiconductor substrate on which a plurality of pixels is formed;
an upper layer film varying in thickness and laminated on the semiconductor substrate; and
on-chip lenses formed on the upper layer film so as to correspond to respective pixels, a pupil correction amount of at least one of the on-chip lenses being changed depending on a distance between a center of a pixel area and the at least one on-chip lens, and depending on the film thickness of the upper layer film at a position of the at least one on-chip lens on the upper layer film, wherein the film thickness of the upper layer film at the position of the at least one on-chip lens is the distance between the at least one on-chip lens and the semiconductor substrate.

2. The solid-state imaging apparatus according to claim 1, wherein the film thickness of the upper layer film is represented by a function of a distance from a factor differentiating the film thickness of the upper layer film.

3. The solid-state imaging apparatus according to claim 2, wherein the function is a linear function.

4. The solid-state imaging apparatus according to claim 2, wherein the function is a non-linear function.

5. The solid-state imaging apparatus according to claim 2, wherein the upper layer film includes color filters formed so as to correspond to the respective pixels, and wherein a pupil correction amount of one of the color filters is changed depending on a distance between the center of the pixel area and the color filter, and depending on a film thickness of the upper layer film at a position of the color filter on the upper layer film.

6. The solid-state imaging apparatus according to claim 2, wherein the upper layer film includes light-shielding films formed so as to correspond to the respective pixels, and wherein a pupil correction amount of one of the light-shielding films is changed depending on a distance between the center of the pixel area and the light-shielding film, and depending on a film thickness of the upper layer film at a position of the light-shielding film on the upper layer film.

7. The solid-state imaging apparatus according to claim 2, wherein the factor differentiating the film thickness of the upper layer film is an OPB (Optical Black) pixel.

8. The solid-state imaging apparatus according to claim 2, wherein the factor differentiating the film thickness of the upper layer film is a through hole via.

9. The solid-state imaging apparatus according to claim 2, wherein the factor differentiating the film thickness of the upper layer film is an electrode pad.

10. The solid-state imaging apparatus according to claim 2, wherein the factor differentiating the film thickness of the upper layer film is a wiring.

11. The solid-state imaging apparatus according to claim 2, wherein the factor differentiating the film thickness of the upper layer film is a scribe line.

12. A method of producing a solid-state imaging apparatus including a semiconductor substrate on which a plurality of pixels is formed, an upper layer film varying in thickness and laminated on the semiconductor substrate, and on-chip lenses formed on the upper layer film so as to correspond to the respective pixels, comprising:
    forming the on-chip lenses by changing a pupil correction amount of one or more of the on-chip lenses depending on a distance between a center of a pixel area and the one or more on-chip lenses, and depending on a film thickness of the upper layer film at a position of the one or more on-chip lenses on the upper layer film, wherein the film thickness of the upper layer film at the position of the one or more on-chip lenses is the distance between the one or more on-chip lenses and the semiconductor substrate.

13. The method according to claim 12, wherein the film thickness of the upper layer film is represented by a function of a distance from a factor differentiating the film thickness of the upper layer film.

14. The method according to claim 13, wherein the function is at least one of a linear function and a non-linear function.

15. The method according to claim 13, wherein the factor differentiating the film thickness of the upper layer film is at least one of a through hole via, an electrode pad, a wiring, an OPB (Optical Black) pixel, and a scribe line.

16. An electronic apparatus, comprising
    a solid-state imaging apparatus including:
        a semiconductor substrate on which a plurality of pixels is formed;
        an upper layer film varying in thickness and laminated on the semiconductor substrate; and
        on-chip lenses formed on the upper layer film so as to correspond to respective pixels, a pupil correction amount of at least one of the on-chip lenses being changed depending on a distance between a center of a pixel area and the at least one on-chip lens, and depending on a film thickness of the upper layer film at a position of the at least one on-chip lens on the upper layer film, wherein the film thickness of the upper layer film at the position of the at least one on-chip lens is the distance between the at least one on-chip lens and the semiconductor substrate.

17. The electronic apparatus according to claim 16, wherein the film thickness of the upper layer film is represented by a function of a distance from a factor differentiating the film thickness of the upper layer film.

18. The electronic apparatus according to claim 16, wherein the factor differentiating the film thickness of the upper layer film is at least one of a through hole via, an electrode pad, a wiring, an OPB (Optical Black) pixel, and a scribe line.

19. The electronic apparatus according to claim 17, wherein the function is a linear function.

20. The electronic apparatus according to claim 17, wherein the function is a non-linear function.

* * * * *